(12) United States Patent
Yaguchi et al.

(10) Patent No.: US 11,177,109 B2
(45) Date of Patent: Nov. 16, 2021

(54) SPECIMEN HOLDER AND CHARGED PARTICLE BEAM DEVICE PROVIDED WITH SAME

(71) Applicant: Hitachi High-Tech Corporation, Tokyo (JP)

(72) Inventors: Toshie Yaguchi, Tokyo (JP); Yasuhira Nagakubo, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 303 days.

(21) Appl. No.: 16/301,910

(22) PCT Filed: May 23, 2016

(86) PCT No.: PCT/JP2016/065111
§ 371 (c)(1),
(2) Date: Nov. 15, 2018

(87) PCT Pub. No.: WO2017/203553
PCT Pub. Date: Nov. 30, 2017

(65) Prior Publication Data
US 2019/0180978 A1  Jun. 13, 2019

(51) Int. Cl.
*H01J 37/20* (2006.01)
*H01J 37/26* (2006.01)
*B05B 1/00* (2006.01)

(52) U.S. Cl.
CPC ............... *H01J 37/26* (2013.01); *B05B 1/00* (2013.01); *H01J 37/20* (2013.01);
(Continued)

(58) Field of Classification Search
CPC .. H01J 37/12; H01J 37/20; H01J 37/26; H01J 37/28; H01J 37/228; H01J 2237/006;
(Continued)

(56) References Cited

U.S. PATENT DOCUMENTS

2008/0067374 A1  3/2008  Ono et al.
2008/0093565 A1  4/2008  Yaguchi et al.
(Continued)

FOREIGN PATENT DOCUMENTS

CN  103650096 A  3/2014
CN  104520967 A  4/2015
(Continued)

OTHER PUBLICATIONS

International Search Report (PCT/ISA/210) issued in PCT Application No. PCT/JP2016/065111 dated Aug. 30, 2016 with English translation (four (4) pages).
(Continued)

*Primary Examiner* — David E Smith
*Assistant Examiner* — Hsien C Tsai
(74) *Attorney, Agent, or Firm* — Crowell & Moring LLP

(57) ABSTRACT

The present invention addresses a problem of providing a specimen holder capable of observing phenomena on the surface and in the inner part of a specimen, the phenomena being generated in different gas spaces, and a charged particle beam device provided with the specimen holder. In order to solve this problem, a specimen holder for a charged particle beam device which observes a specimen using a charged particle beam is configured such that the specimen holder includes a first gas injection nozzle capable of injecting a first gas to a first portion of a specimen, a second gas injection nozzle capable of injecting a second gas to a second portion of the specimen, the second portion being different from the first portion, and a partition part provided between the first gas injection nozzle and the second gas injection nozzle.

26 Claims, 12 Drawing Sheets

(52) U.S. Cl.
CPC . *H01J 2237/006* (2013.01); *H01J 2237/2001* (2013.01); *H01J 2237/20214* (2013.01)

(58) Field of Classification Search
CPC ....... H01J 2237/2003; H01J 2237/2007; H01J 2237/2065; H01J 2237/2802; H01J 2237/31745; H01J 2237/31749
See application file for complete search history.

(56) References Cited

U.S. PATENT DOCUMENTS

| | | | |
|---|---|---|---|
| 2009/0230299 | A1 | 9/2009 | Shichi et al. |
| 2011/0292385 | A1* | 12/2011 | Haustein ............ G01N 23/2251 356/302 |
| 2013/0040400 | A1 | 2/2013 | Konings et al. |
| 2014/0042318 | A1 | 2/2014 | Yaguchi et al. |
| 2014/0123898 | A1 | 5/2014 | Nomaguchi et al. |
| 2015/0213999 | A1 | 7/2015 | Ominami et al. |
| 2015/0228447 | A1 | 8/2015 | Ominami et al. |
| 2015/0348745 | A1 | 12/2015 | Gardiner et al. |
| 2015/0380205 | A1* | 12/2015 | Parker .................... H01J 37/12 250/398 |
| 2016/0093464 | A1 | 3/2016 | Suzuki et al. |

FOREIGN PATENT DOCUMENTS

| | | |
|---|---|---|
| CN | 104584181 A | 4/2015 |
| CN | 105321787 A | 2/2016 |
| JP | 2007-194096 A | 8/2007 |
| JP | 2007-303946 A | 11/2007 |
| JP | 2012-164674 A | 8/2012 |
| JP | 2014-102879 A | 6/2014 |
| JP | 2015-52576 A | 3/2015 |
| JP | 5699207 B2 | 4/2015 |
| WO | WO 2012/147632 A1 | 11/2012 |
| WO | WO 2016/035493 A1 | 3/2016 |

OTHER PUBLICATIONS

Japanese-language Written Opinion (PCT/ISA/237) issued in PCT Application No. PCT/JP2016/065111 dated Aug. 30, 2016 (three (3) pages).

Nagashima S. et al. "In situ Liquid TEM Study for Degradation Mechanisms of Fuel Cell Catalysts During Potential Cycling Test", Microsc. Microanal., 2015, pp. 1295-1296, vol. 21 (Suppl. 3) Paper No. 0647, DOI: 10.1017/S 1431927615007266, Microscopy Society of America (two (2) pages).

Chinese-language Office Action issued in counterpart Chinese Application No. 201680085834.4 dated Dec. 31, 2019 (eight (8) pages).

Japanese-language Office Action issued in counterpart Japanese Application No. 2018-246439 dated Nov. 5, 2019 with English translation (five (5) pages).

German-language Office Action issued in counterpart Application No. 112016006767.4 dated Aug. 31, 2021 (seven (7) pages).

* cited by examiner

[Fig. 1A]
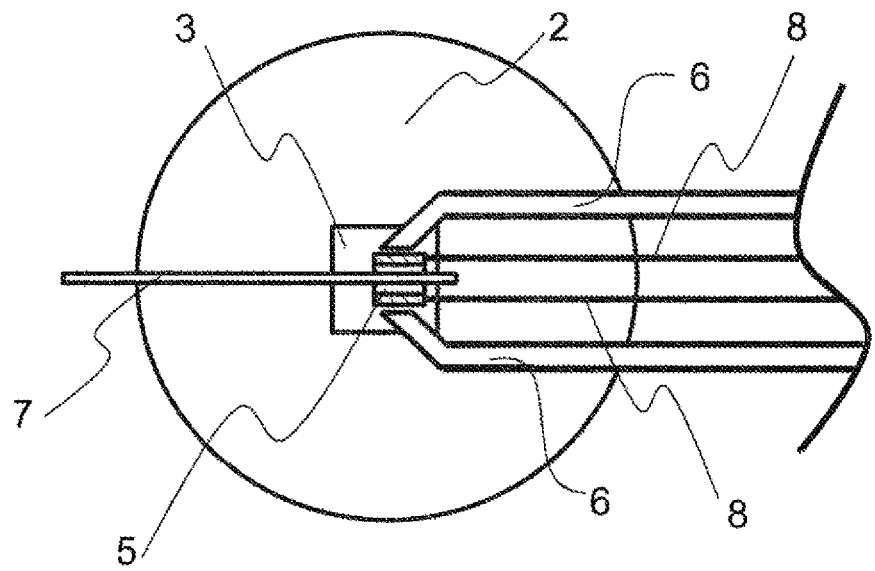
[Fig. 1B]
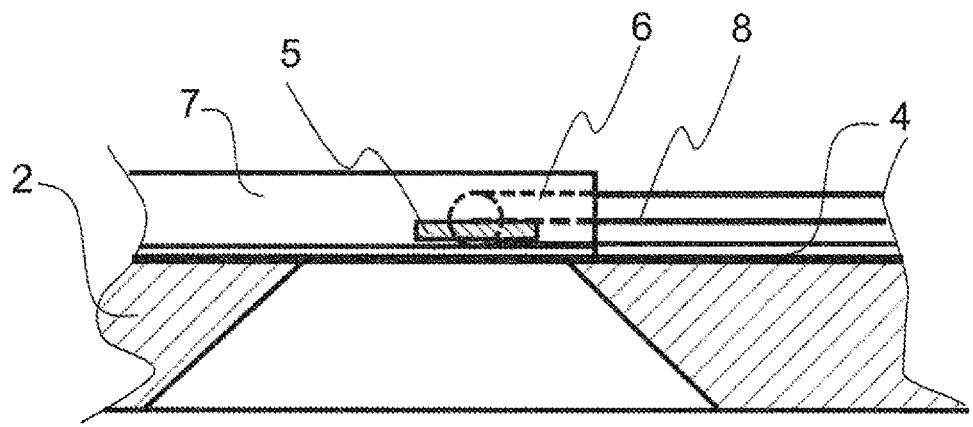

[Fig. 2A]
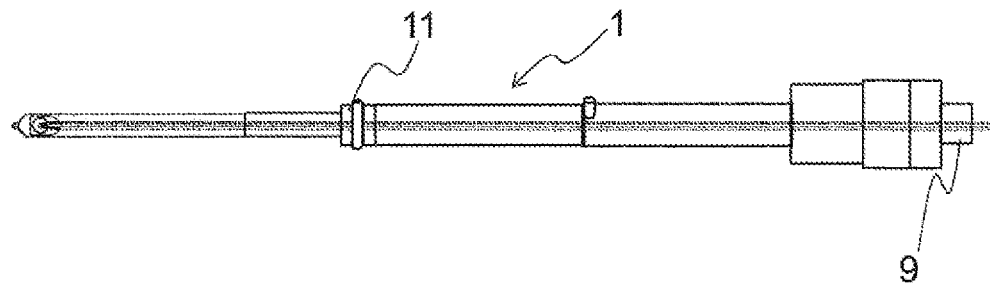
[Fig. 2B]
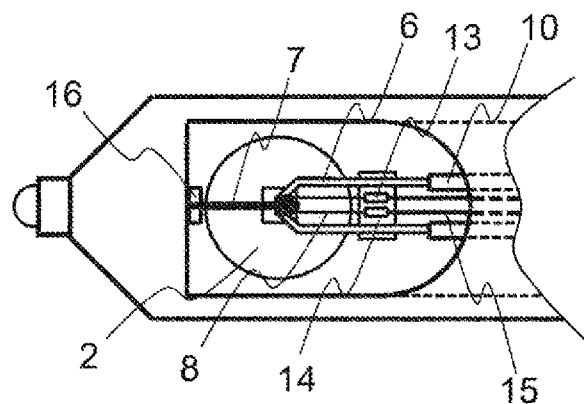
[Fig. 2C]
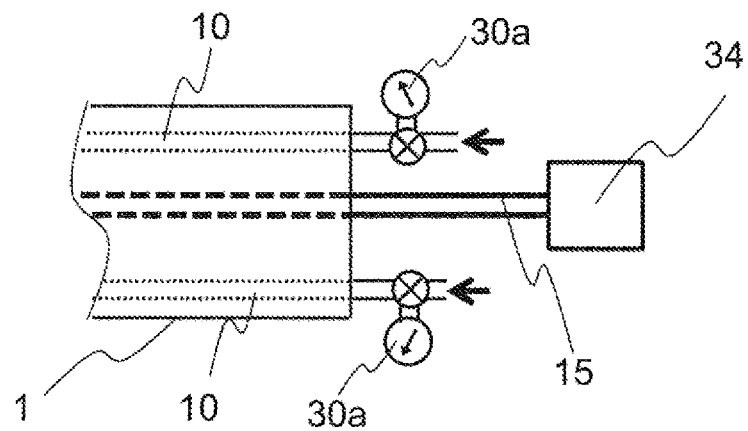

[Fig. 3A]
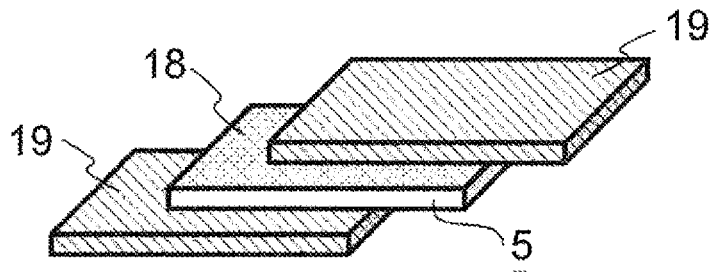
[Fig. 3B]
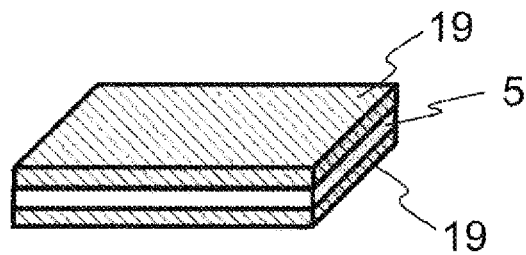
[Fig. 3C]
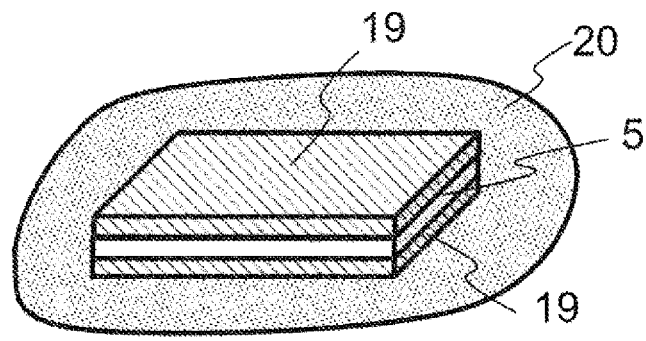

[Fig. 3D]
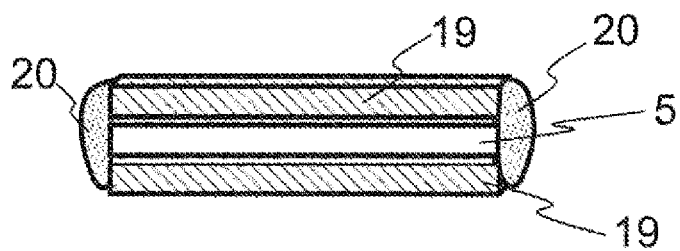
[Fig. 3E]
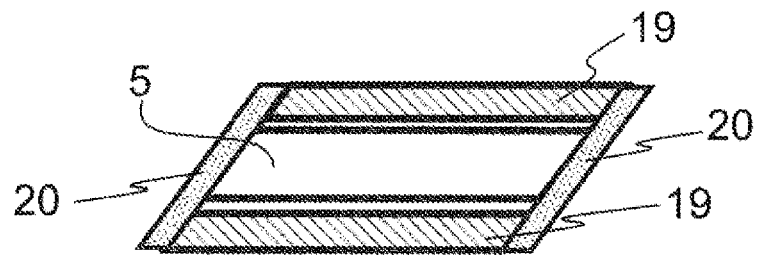

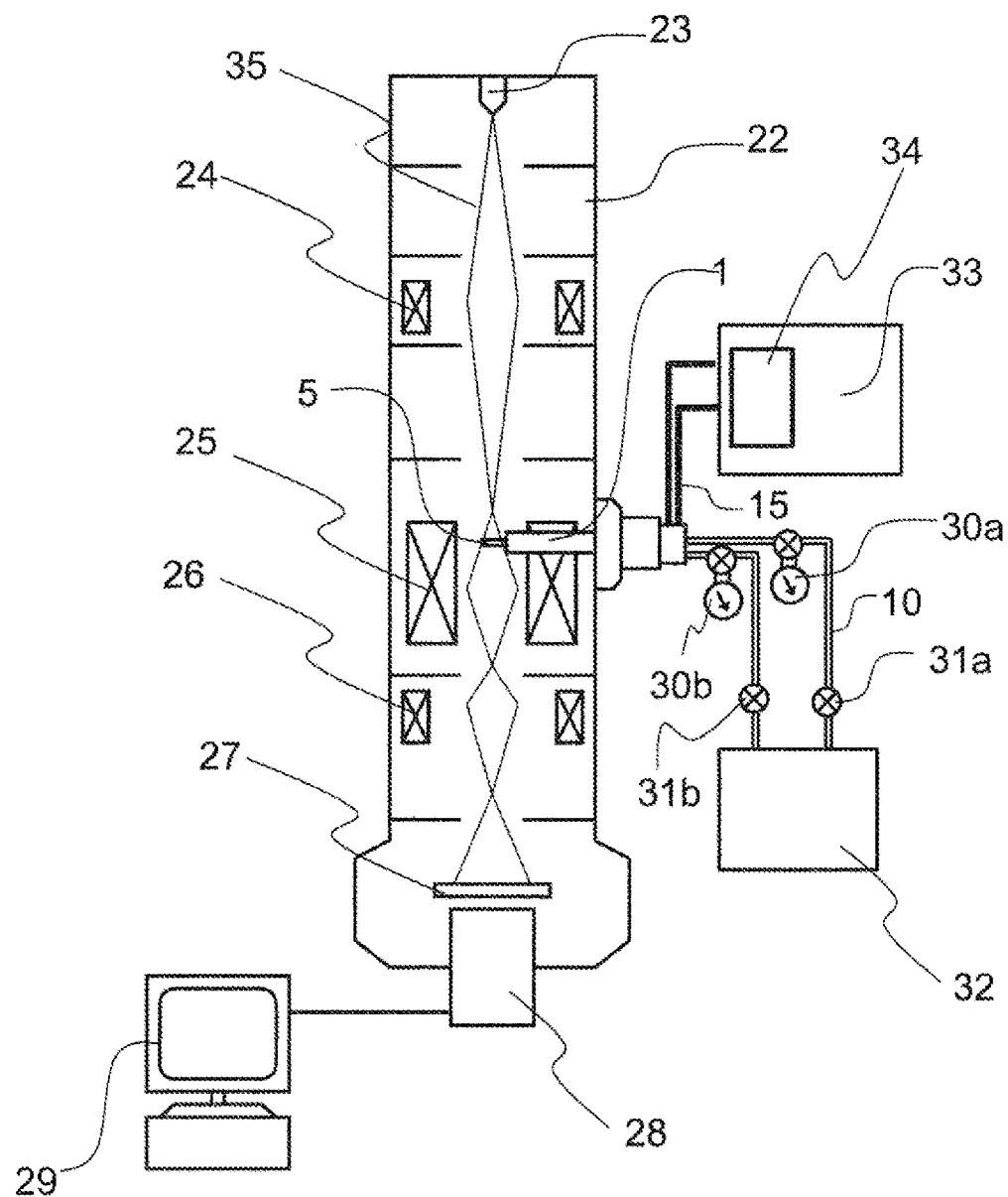
[Fig. 4]

[Fig. 5]
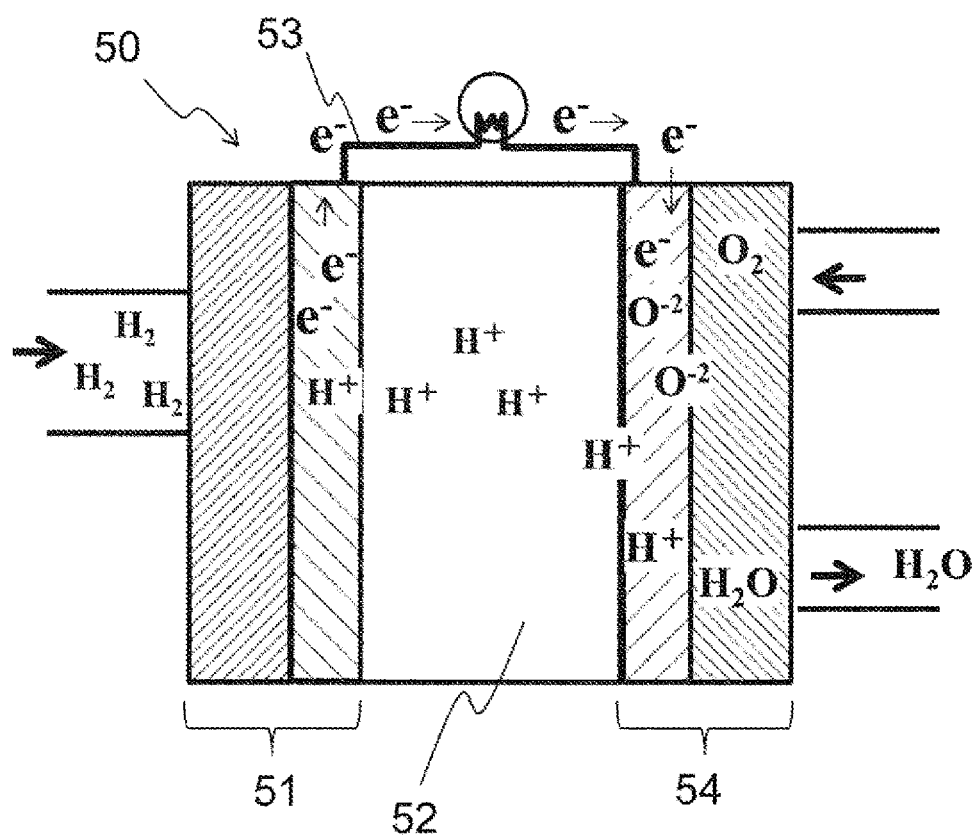

[Fig. 6A]
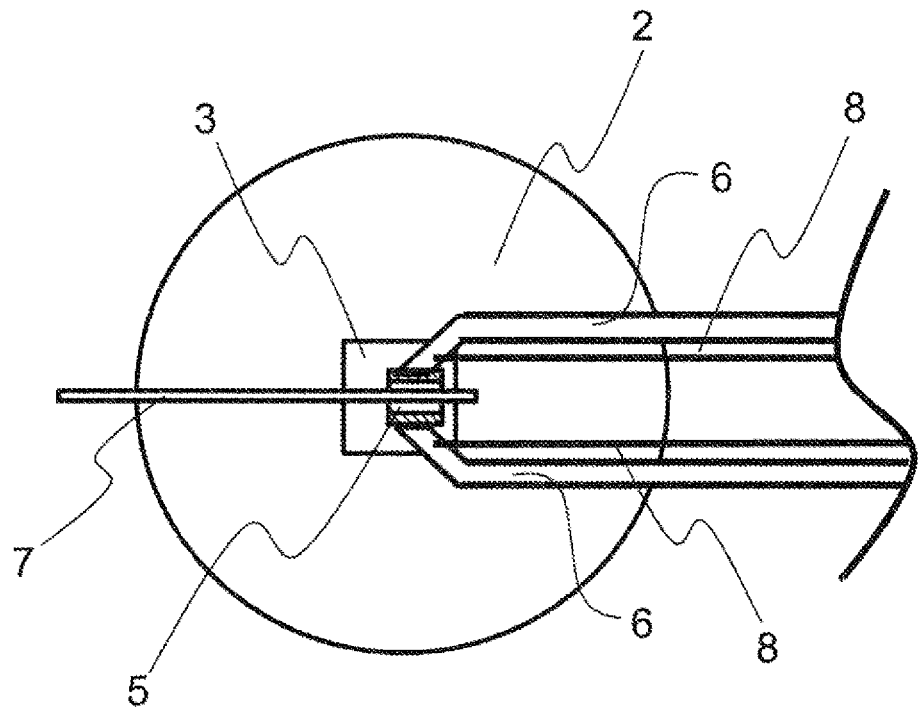
[Fig. 6B]
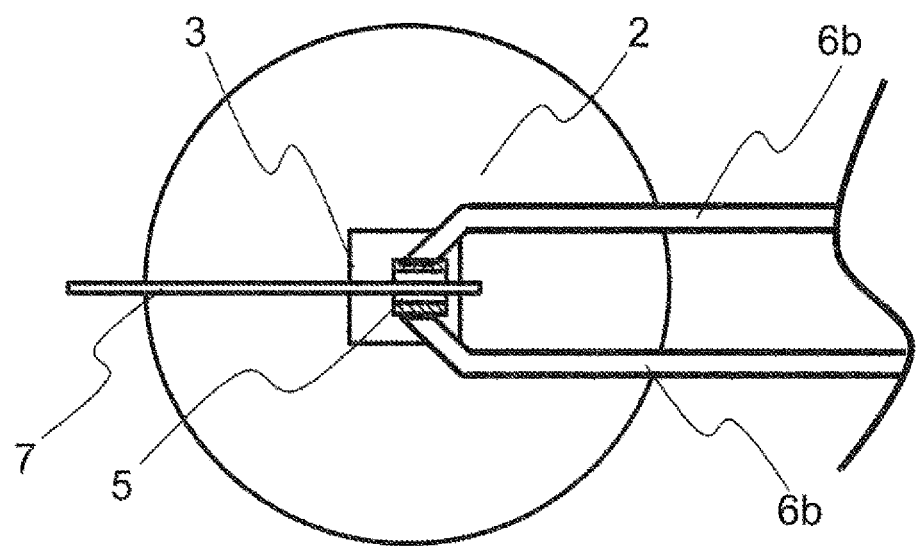

[Fig. 7]
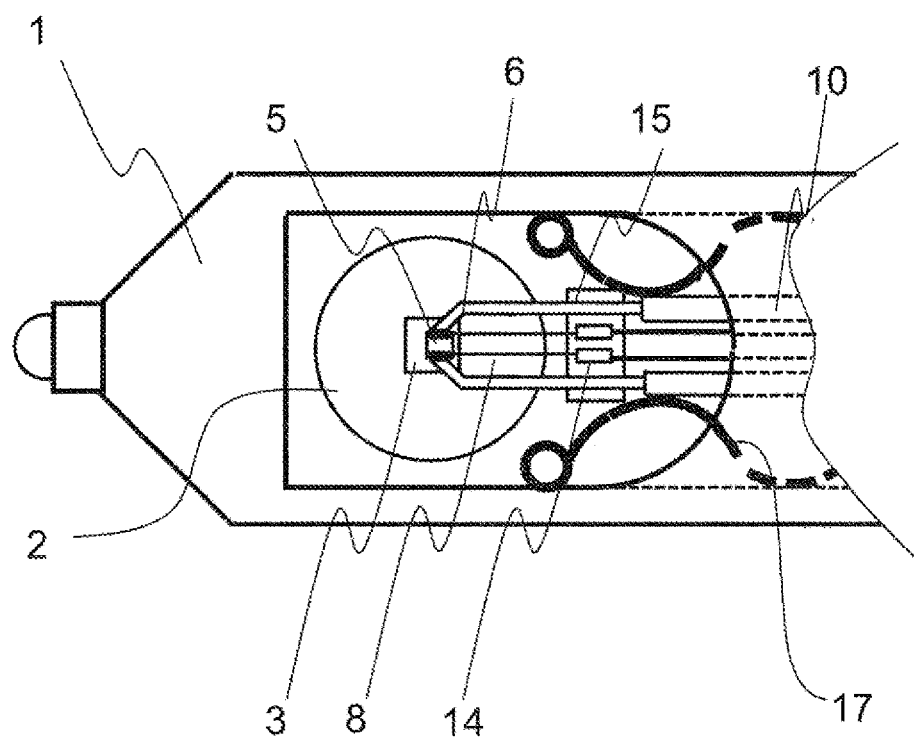

[Fig. 8A]
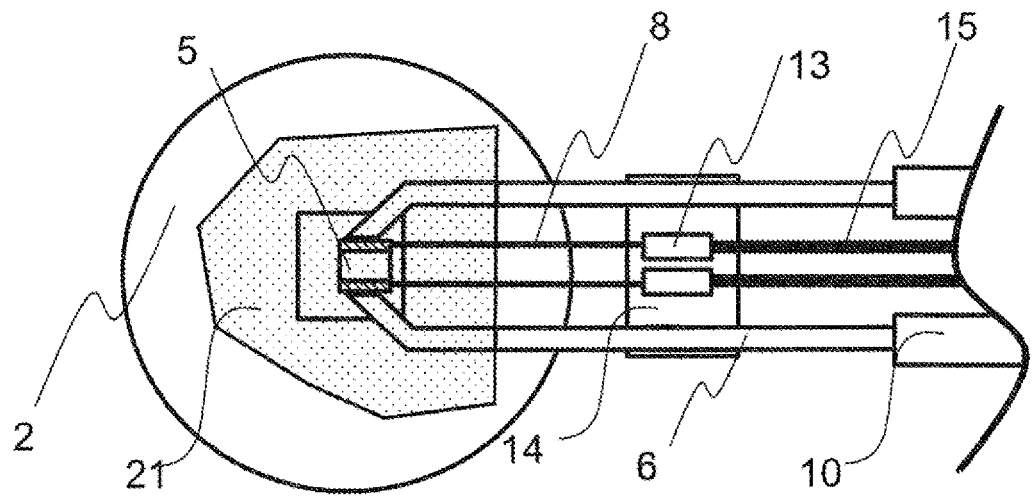
[Fig. 8B]
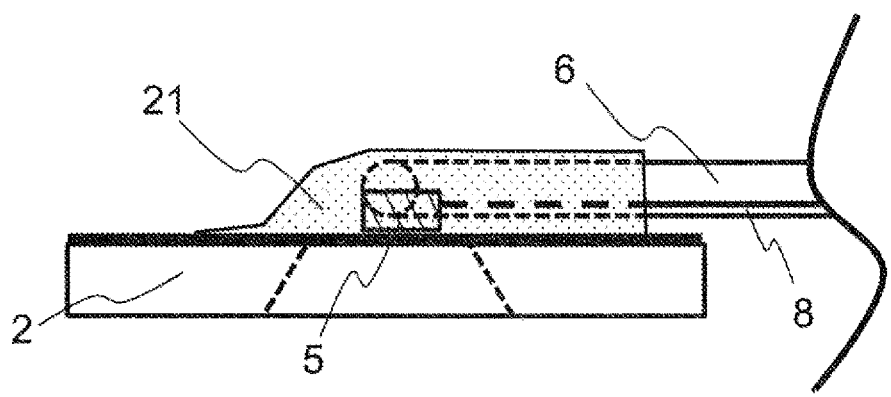
[Fig. 8C]
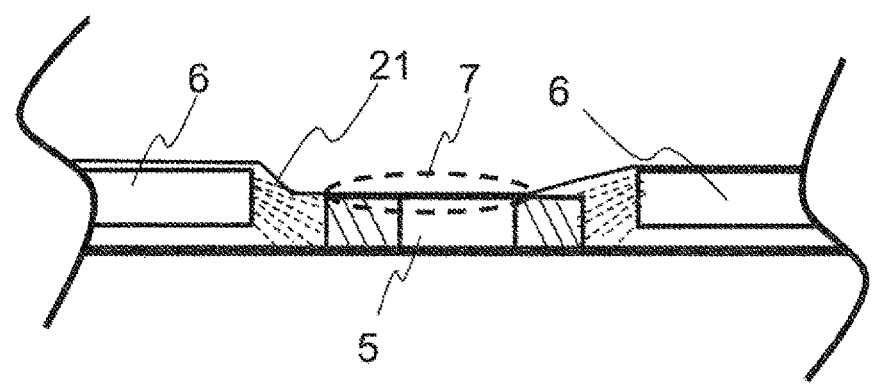

[Fig. 9A]
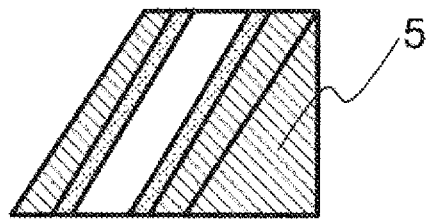
[Fig. 9B]
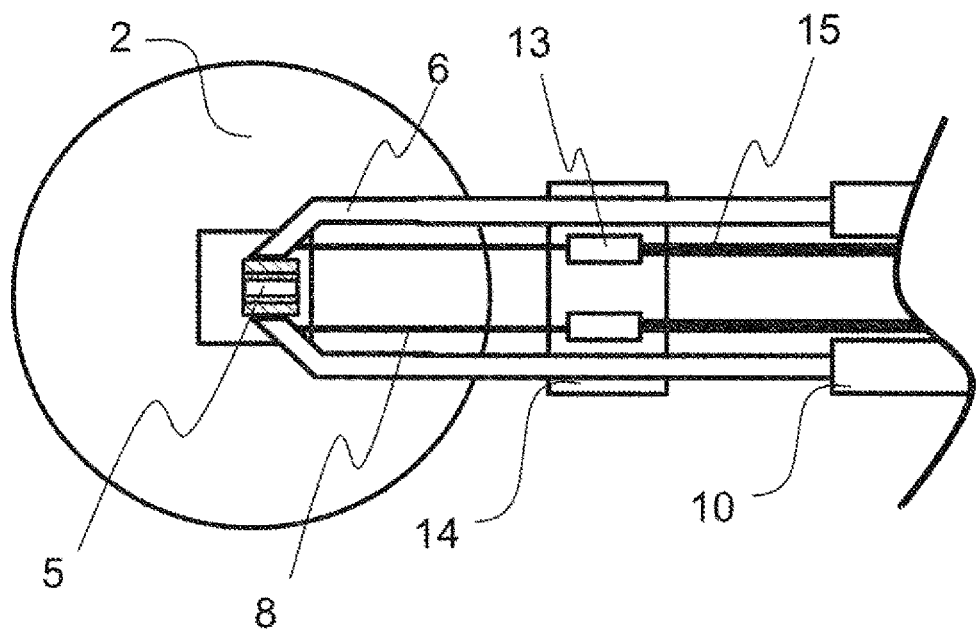
[Fig. 9C]
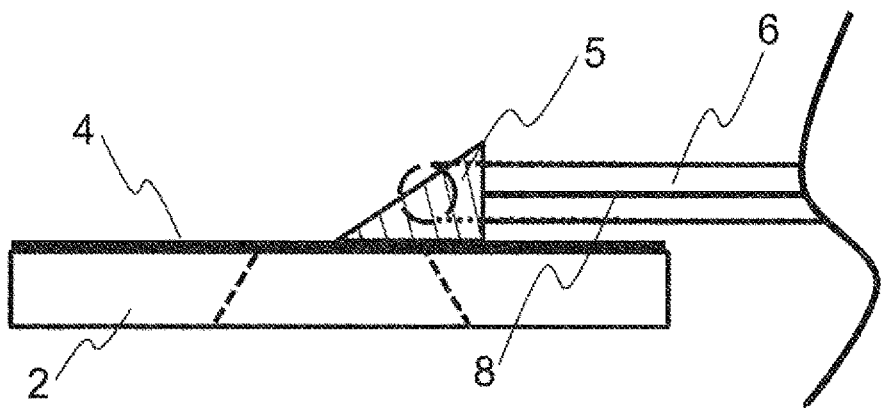

[Fig. 10A]
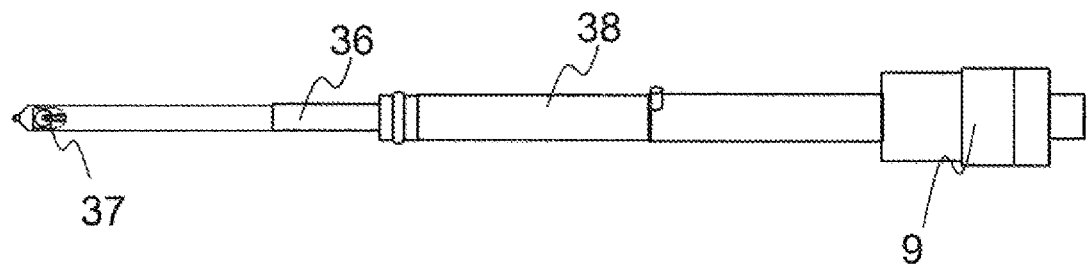
[Fig. 10B]
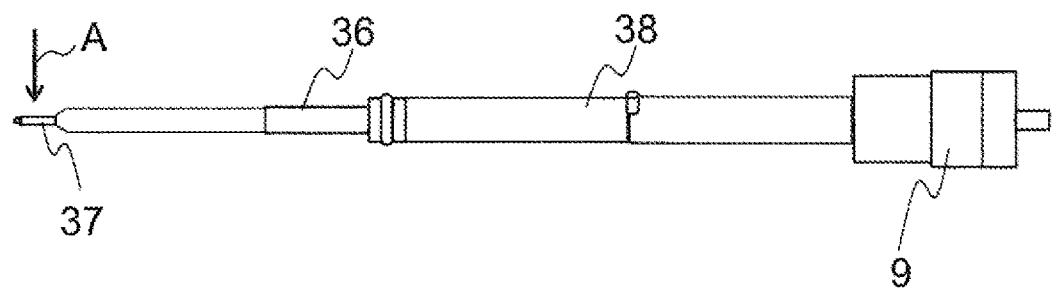
[Fig. 11]
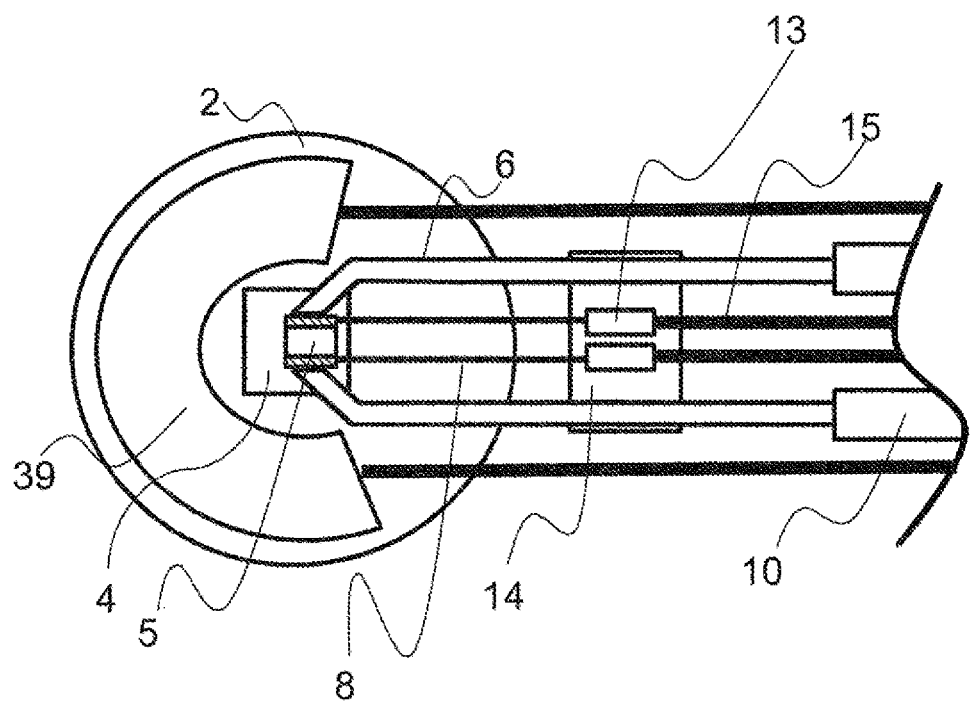

[Fig. 12A]
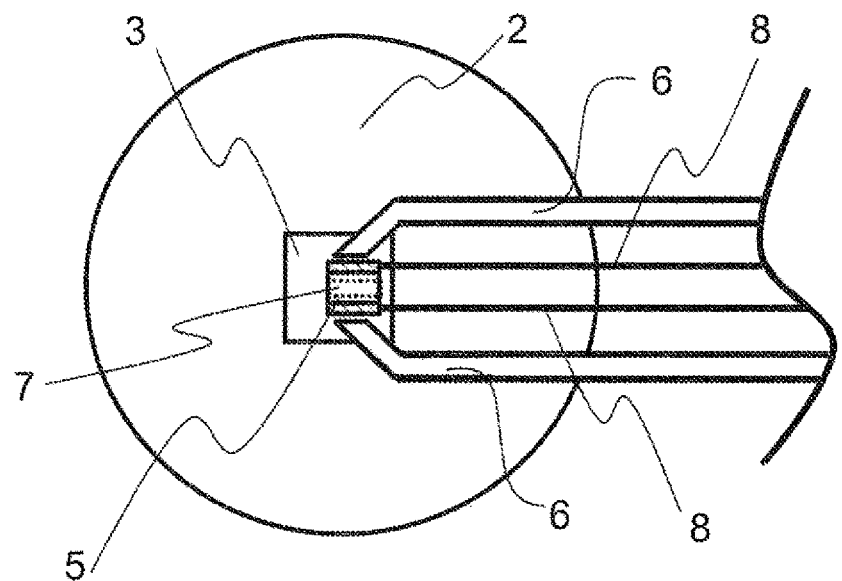
[Fig. 12B]
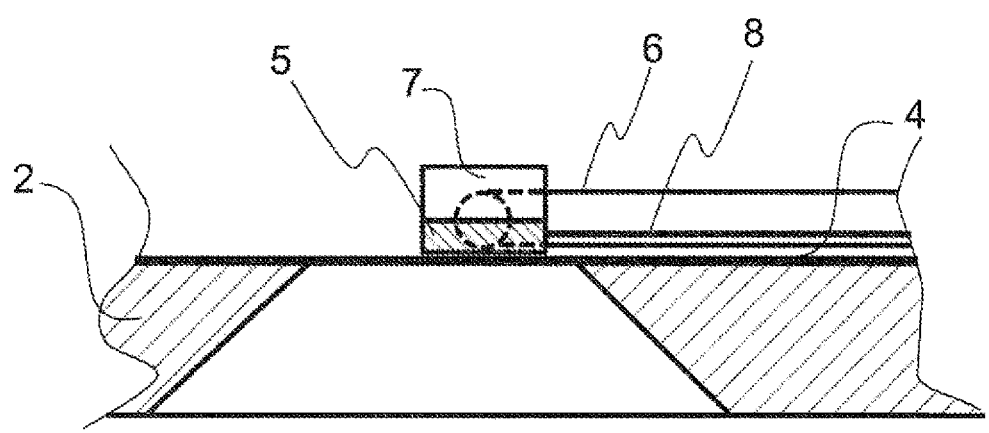

SPECIMEN HOLDER AND CHARGED PARTICLE BEAM DEVICE PROVIDED WITH SAME

TECHNICAL FIELD

The present invention relates to a specimen holder of a charged particle beam device which observes a specimen using a charged particle beam, and a charged particle beam device provided with the specimen holder.

BACKGROUND ART

In an electron microscope, in addition to observing a specimen at room temperature, there is a method of in-situ observation of the specimen by heating to a high temperature, or cooling, applying a voltage, or applying tensile. Alternatively, there is a method of in-situ observation in various gas atmospheres.

As an electron microscope device which, at a high temperature and under a specific atmosphere, applies a voltage to a desired portion of a specimen and observes the reaction in real time, as disclosed in Patent Literature 1, there is a device which mounts a micro sample on a MEMS (Micro Electro Mechanical System) chip provided with an electrode by FIB (Focused Ion Beam), sandwiches and seals with different MEMS chips having a thin film through which an electron beam is transmitted, and introduces a liquid and a gas into that space.

In-situ observation technique is used in observations of various reaction processes, and its application has been attempted as a way of elucidating the catalyst degradation process of a fuel cell and the like. For example, as disclosed in Non Patent Literature 1, there is a method in which a micro simulation cell of a fuel cell is made by MEMS, instead of generating a voltage by introducing hydrogen and air into each electrode, a voltage the same as that at the time of generating electricity is applied, and a change in catalyst particles applied to the electrode in an electrolyte is observed.

CITATION LIST

Patent Literature

[PTL 1] JP-B-5699207

Non Patent Literature

[NPL 1] S. Nagashima et al., In situ Liquid TEM Study for Degradation Mechanisms of Fuel Cell Catalysts during Potential Cycling Test, Microsc. Microanal. 21 (Suppl 3), 2015, p. 1295-1296, DOI: 10.1017/S 1431927615007266

SUMMARY OF INVENTION

Technical Problem

In the aforementioned related art, it has been difficult to introduce different gases separately into different desired portions of a single specimen, and it has been difficult to observe chemical reactions caused thereby and to measure the voltage and current of the specimen. In addition, the observation target has been limited to nano particles in an electrolyte applied to an electrode.

Therefore, for example, in a case of observing the catalyst degradation process of a fuel cell, a structure simulating a chemical reaction was produced by MEMS technique such that the same voltage could be applied to the electrode coated with a catalyst. This is a structure different from an actual fuel cell, and it is also different from the real environment in which a fuel cell operates, and no consideration is given to reactions generated by gas introduction.

Therefore, an object of the invention is to provide a specimen holder capable of observing phenomena on the surface and in the inner part of a specimen, the phenomena being generated in different gas spaces, and a charged particle beam device provided with the specimen holder.

Solution to Problem

In order to solve the above problem, for example, the configurations described in the claims are adopted.

The present application includes a plurality of ways to solve the above problem. As an example thereof, provided is a specimen holder for a charged particle beam device which observes a specimen using a charged particle beam, wherein the specimen holder includes a first gas injection nozzle capable of injecting a first gas to a first portion of the specimen, a second gas injection nozzle capable of injecting a second gas to a second portion, which is different from the first portion, of the specimen, and a partition part provided between the first gas injection nozzle and the second gas injection nozzle.

Advantageous Effects of Invention

According to the invention, it is possible to provide a specimen holder capable of observing phenomena on the surface and in the inner part of a specimen, the phenomena being generated in different gas spaces, and a charged particle beam device provided with the specimen holder.

Problems, configurations and effects other than those mentioned above will be clarified by the following descriptions of embodiments.

BRIEF DESCRIPTION OF DRAWINGS

FIG. 1A is a partially enlarged top view of a specimen holder 1 (Embodiment 1).

FIG. 1B is a partial sectional view of the specimen holder 1 (Embodiment 1).

FIG. 2A is an overall view of the specimen holder 1 (Embodiment 1).

FIG. 2B is an enlarged top view of a tip part of the specimen holder 1 (Embodiment 1).

FIG. 2C is a structural view of a grip 9 part of the specimen holder 1 (Embodiment 1).

FIG. 3A is an illustrative view of a preparation method of a specimen.

FIG. 3B is an illustrative view of a preparation method of a specimen.

FIG. 3C is an illustrative view of a preparation method of a specimen.

FIG. 3D is an illustrative view of a preparation method of a specimen.

FIG. 3E is an illustrative view of a preparation method of a specimen.

FIG. 4 is a basic structural view of an electron microscope 22.

FIG. 5 is an illustrative view of the operation of a fuel cell.

FIG. 6A is a partially enlarged top view of the specimen holder 1 (Embodiment 2).

FIG. 6B is a partially enlarged top view of the specimen holder 1 (Embodiment 3).

FIG. 7 is an enlarged top view of the tip of the specimen holder 1 (Embodiment 4).

FIG. 8A is a partially enlarged top view of the tip part of the specimen holder 1 (Embodiment 5).

FIG. 8B is a longitudinal sectional view of the specimen holder 1 (Embodiment 5).

FIG. 8C is a cross-sectional view of the specimen holder 1 (Embodiment 5).

FIG. 9A is a diagram showing the shape of a specimen 5 (Embodiment 6).

FIG. 9B is a partially enlarged top view of the specimen holder 1 (Embodiment 6).

FIG. 9C is a partially enlarged sectional view of the specimen holder 1 (Embodiment 6).

FIG. 10A is a top view of the specimen holder 1 (Embodiment 7).

FIG. 10B is a diagram showing a state in which a central axis 36 of the specimen holder 1 of FIG. 10A has rotated 90 degrees (Embodiment 7).

FIG. 11 is a partially enlarged top view of the tip part of the specimen holder 1 (Embodiment 8).

FIG. 12A is a partially enlarged top view of the specimen holder 1 (Embodiment 9).

FIG. 12B is a partial sectional view of the specimen holder 1 (Embodiment 9).

DESCRIPTION OF EMBODIMENTS

Embodiments of the invention will be described below with reference to the drawings. In the following description, an electron microscope will be described as an example for a charged particle beam device which observes a specimen using a charged particle beam.

Embodiment 1

FIG. 1A and FIG. 1B show a partially enlarged top view (FIG. 1A) and a sectional view (FIG. 1B) of a specimen holder 1 for a charged particle beam device which observes a specimen using a charged particle beam. A frame 2 for specimen supporting film is a circular Si chip made by MEMS and has in center a square frame window 3 which becomes a part through which an electron beam is transmitted, and a specimen supporting film 4 having a thickness through which the electron beam is transmittable is stretched on one surface of the Si chip. The specimen supporting film 4 is an insulating material such as SiN. A specimen 5 which has been cut into a small piece is mounted on the specimen supporting film 4 positioned at the frame window 3 part. Two gas injection nozzles 6 having a gas introduction port facing the specimen 5 respectively are disposed at both ends of the specimen 5. At the central part of the specimen 5 which is positioned between the gas injection nozzles 6, there is a partition 7 for blocking gas atmospheres injected from each of the gas injection nozzles 6. The distance between the gas injection port of the gas injection nozzle 6 and the specimen 5 is preferably 1 mm or less. In addition, voltage measuring terminals 8 (electrodes) are in contact with two end parts of the specimen 5.

FIG. 2A shows an overall view of the specimen holder 1, FIG. 2B shows an enlarged top view of a tip part of the specimen holder 1, and FIG. 2C shows a structural view of a grip 9 part of the specimen holder 1. A gas introduction pipe 10 connected to the gas injection nozzle 6 passes through the inside of the axis of the specimen holder 1 and is connected from the inside of the vacuum to the outside of the vacuum. The tip part from an O ring 11 mounted on the axis of the specimen holder 1 is inserted into a vacuum part in a column of an electron microscope. As shown in FIG. 4, the gas injection nozzle 6 is connected to a gas supply unit 32 via the gas introduction pipe 10 passing through the inside of the axis of the specimen holder 1. The voltage measuring terminal 8 is connected to a lead wire and measuring terminal connection part 13. The lead wire and measuring terminal connection part 13 is fixed to a lead wire and measuring terminal connection base 14 which is an insulating material, and the lead wire and measuring terminal connection base 14 is fixed to the specimen holder 1. As shown in FIG. 4, a lead wire 15 is connected a voltage current measuring part 34 inside a voltage control part 33 outside the column of the electron microscope. A voltage power supply for applying a voltage to the specimen 5 via the voltage measuring terminal 8 is provided inside the voltage control part 33. The frame 2 for specimen supporting film is fixed to the specimen holder 1 by adhesion or the like. The partition 7 which blocks the gas atmospheres is a detachable plate-shaped member and is sandwiched by a partition holding part 16 of the specimen holder 1.

FIG. 3A to FIG. 3E show a preparation method of a specimen. FIG. 3A is a three dimensional exploded view of the specimen in the state of FIG. 3B. In order to ensure contact between a voltage generating part or a voltage applying part 18 of the specimen 5 and the voltage measuring terminal 8, as shown in FIG. 3B, a conductive film 19 (Au foil or a similar conductive material) serving as a terminal necessary for electrical measurement is adhered to the voltage generating part or the voltage applying part 18 of the specimen 5. As shown in FIG. 3C, the specimen 5 to which the conductive film 19 is adhered is embedded in a resin 20. As shown in FIG. 3D, each cross section is subjected to thinning and trimming by a microtome such that each cross section has a thickness through which an electron beam is transmittable. As shown in FIG. 3E, the trimmed thin film part is arranged on the specimen supporting film 4 such that the trimmed thin film part is in a direction to be connectable to the voltage measuring terminal 8. This surely makes it possible to measure the voltage generated in the thin film part.

FIG. 4 shows a basic structural view of the electron microscope 22 provided with the specimen holder 1 of the invention. The column of the electron microscope 22 includes an electron gun 23, a condenser lens 24, an objective lens 25, and a projector lens 26. The specimen holder 1 is inserted between the condenser lenses 24, and the objective lenses 25. A fluorescent screen 27 is installed under the projector lens 26, and a camera 28 is installed under the fluorescent screen 27. The camera 28 is connected to an image display part 29. The gas introduction pipe 10 of the specimen holder 1 is connected to the gas supply unit 32 via flow meters 30a and 30b and gas pressure control valves 31a and 31b. The lead wire 15 of the specimen holder 1 is connected to the voltage current measuring part 34 inside the voltage control part 33 outside the column of the electron microscope 22.

The electron beam 35 generated from the electron gun 23 is converged by the condenser lens 24 and is irradiated onto the specimen 5. The electron beam 35 transmitted through the specimen 5 is focused by the objective lens 25, enlarged by the projector lens 26, and projected on the fluorescent screen 27. Alternatively, the fluorescent screen 27 may be removed from the path of the electron beam 35, and the electron beam 35 transmitted through the specimen 5 may be projected on the camera 28 such that a transmitted image is displayed on the image display part 29. The gas injection nozzle 6 is installed in the vicinity of the specimen 5 so as to spray a gas.

While observing the reaction of the specimen 5 by the transmitted electron image projected on the fluorescent screen 27 or the camera 28 while spraying a small amount of gas to the specimen 5, it is also possible to measure the voltage generated by the reaction of the specimen 5 with the gas. Alternatively, it is also possible to observe a change in the specimen 5 to which a voltage has been applied under the gas introduction. In this case, the specimen 5 is placed on the plane of the specimen supporting film 4 and the adhesiveness between the specimen 5 and the specimen supporting film 4 is increased, and thus the gas is introduced from a side different from the specimen supporting film 4 side of the specimen 5. Therefore, the gas is introduced only from the surface of the specimen 5, and it is possible to capture the change in the inner part due to the locally introduced gas without exposing the back surface of the specimen 5 to the gases mixed at the position distant from the specimen 5.

In addition to the transmission electron microscope using the aforementioned transmitted electron image, the invention can also be implemented by a scanning electron microscope using a secondary electron image. In the case of the scanning electron microscope, the projector lens 26 is unnecessary, and a narrowed electron beam having several tens of keV or less of electron beam incident energy is scanned on the surface of the specimen 5 to detect secondary electrons generated from the surface of the specimen 5. In this way, it is possible to observe the reaction state of the surface of the specimen 5.

FIG. 5 is an illustrative view of the operation of a fuel cell. The fuel cell is an example of a technical field in which the observation according to the invention is considered to be beneficial. The fuel cell has a basic structure called Membrane Electrode Assembly (MEA) having an electrode on both sides sandwiching an electrolyte membrane in the center. Currently, a carbon-based carrier (carbon black, graphitized carbon, Ketjen black, etc.) and noble metal fine particle catalysts of platinum (Pt) or Pt alloy nano particles are used for both electrodes. Fuel such as hydrogen ($H_2$ in FIG. 5) is supplied to an anode 51 of a membrane electrode assembly 50 and is decomposed into protons ($H^+$ in FIG. 5) and electrons ($e^-$ in FIG. 5). The protons move to a cathode 54 passing through an electrolyte membrane 52, and the electrons move to the cathode 54 passing through a conducting wire 53. In the cathode 54, the protons from the electrolyte membrane 52 and the electrons from the conducting wire react with oxygen ($O_2$ in FIG. 5) in the air to produce water ($H_2O$ in FIG. 5). For example, by preparing the specimen 5 imitating the fuel cell MEA, setting the same to the specimen holder 1 of the invention, and spraying different gases to each electrode, it is possible to perform an observation simulating the operation state of the fuel cell in real time.

Embodiment 2

FIG. 6A shows a partially enlarged top view of another embodiment of the specimen holder 1. Since the gas injection nozzle 6 is conductive, as shown in FIG. 6A, instead of bringing the voltage measuring terminal 8 into contact with the specimen 5, the voltage measuring terminal 8 may be brought into contact with the gas injection nozzle 6, and the gas injection nozzle 6 may be brought into contact with both ends of the specimen 5. It is difficult to bring the voltage measuring terminal 8 into contact with the small specimen 5 in Embodiment 1. However, in the present embodiment, it is possible to measure the voltage of the specimen 5 only by sandwiching the specimen 5 with the gas injection nozzle 6.

Embodiment 3

FIG. 6B shows a partially enlarged top view of another embodiment of the specimen holder 1. Since the gas injection nozzle 6 is conductive, as shown in FIG. 6B, gas injection nozzles 6b may be brought into contact with the specimen 5 and connected to the voltage current measuring part by the lead wire 15, etc. such that the gas injection nozzle 6 plays the role of the voltage measuring terminal 8 itself. Similar to Embodiment 2, in the present embodiment, it is possible to measure the voltage of the specimen 5 only by sandwiching the specimen 5 with the gas injection nozzle 6.

Embodiment 4

FIG. 7 shows an enlarged top view of the tip of another embodiment of the specimen holder 1. The gas injection nozzle 6 may be fixed with a leaf spring 17 so as to bring the gas injection nozzles 6 into contact with both ends of the specimen 5. In this way, both of the gas injection nozzle 6 and the specimen 5 are fixed. The tip part of the leaf spring 17 is ring-shaped. By inserting the tips of tweezers into the ring parts and tweezing, the springs are loosened and it is possible to release the fixation.

Embodiment 5

FIG. 8A to FIG. 8C show a partially enlarged top view (FIG. 8A), a longitudinal sectional view (FIG. 8B) and a cross-sectional view (FIG. 8C) of the tip part of the specimen holder 1. After the specimen 5 and the voltage measuring terminal 8 are set and the gas injection nozzle 6 is also disposed at a predetermined position, they are covered with a polymer film 21 so as to include each voltage measuring terminal 8, the gas injection nozzle 6 and the specimen 5. As a result, the polymer film 21 is adhered to the specimen 5 part and the partition 7 is formed as shown in FIG. 8C. Since the gas injection nozzles 6 are separated from each other, it is possible to form different gas spaces at different parts of the same specimen 5.

Embodiment 6

FIG. 9A shows the shape of another embodiment of the specimen 5, FIG. 9B shows a partially enlarged top view of the specimen holder 1 in which the specimen 5 of FIG. 9A is disposed, and FIG. 9C shows a partially enlarged sectional view of the specimen holder 1 of FIG. 9A. In the case of the shape of the specimen 5 as shown in Embodiment 1, an overall observation is possible. However, the volume of the specimen 5 is small, and thus the amount of current is small, and it is difficult to measure the changes in voltage and current. Therefore, instead of cutting the specimen 5 from the state in FIG. 3C into a thin film shape, the specimen 5 is cut into a shape, for example, a wedge shape, having a thick part and a thin part. In the thick part, the amount of reaction can be increased, while in the thin part, a transmitted image can be easily obtained. Therefore, by using the thick part of the specimen 5 as a contact part with the voltage measuring terminal 8 and using the thin part as a transmitted image observation part, it becomes possible to measure the changes in voltage and current generated in the inner part of the specimen 5 and to observe the transmitted image at the same time. In addition, this shape of the specimen 5 also has an effect of easy operation.

Embodiment 7

FIG. 10A shows a top view of the specimen holder 1 in a case where the specimen holder 1 is configured as a side-entry type specimen holder for an electron microscope, and FIG. 10B shows a state in which the central axis 36 of the specimen holder 1 of FIG. 10A has rotated 90 degrees. The specimen holder 1 has an outer shell 38 which separately rotates coaxially with the specimen holding part 37, and the outer shell 38 can be inclined at least ±90 degrees. As a result, for example, when the electron beam 35 is incident in the direction of the arrow A in FIG. 10B, by observing in the state of FIG. 10B and in a state in which it has rotated 180 degrees from the state of FIG. 10B, it becomes possible to observe a secondary electron image and a back scattered electron image of the surface state on each electrode side.

Embodiment 8

FIG. 11 shows a partially enlarged top view of the tip part of another embodiment of the specimen holder 1. A heater 39 is provided on the specimen supporting film 4, and the heater 39 is connected to a heating power supply installed outside the column. By heating the heater 39, the specimen supporting film 4 is heated and it becomes possible to heat the specimen 5. This makes it possible to observe the reaction of the specimen 5 with the gas supplied from the gas injection nozzle 6 during the heating of the specimen 5.

Embodiment 9

FIG. 12A and FIG. 12B show a partially enlarged top view (FIG. 12A) and a sectional view (FIG. 12B) of another embodiment of the specimen holder 1. The partition 7 partitioning the gas spaces is formed by a plate-shaped member in Embodiments 1 to 3, and is formed by the polymer film 21 in Embodiment 5. However, the partition 7 may also be formed by the specimen 5 itself. For example, as shown in FIG. 12A and FIG. 12B, among the portions of the specimen 5, the portion positioned between the two gas injection nozzles 6 may be formed thick enough to block the gas atmosphere injected from each gas injection nozzle 6, and the other portions may be formed thin.

In any one of the embodiments, as the formation of the partition 7, a formation by a plate-shaped member, by the polymer film 21, or by the shape of the specimen 5 itself may be appropriately adopted, and a combination thereof may also be adopted.

The effects of the invention will be summarized below.

By adopting the invention, it is possible to observe phenomena on the surface and in the inner part of a specimen generated in different gas spaces.

Moreover, it is possible to observe in real time the change due to the voltage of the specimen or the changes due to polarity in different gas spaces, and to measure the voltage and current.

In addition, it is possible to observe the reaction of the specimen with a gas supplied by a gas supply unit during heating of the specimen.

Further, it is possible to form different small gas atmospheres containing the specimen using a charged particle beam device without affecting the vacuum state of the charged particle beam device with a small amount of gas, and to perform at the same time an observation of a change in the specimen structure in the atmosphere and a measurement of voltage and current generated in the specimen.

In addition, it is possible to perform a dynamic observation at the atomic level and a measurement of voltage and current inside the specimen while heating and applying the voltage in a small gas atmosphere.

The invention is not limited to the embodiments described above, and it includes all kinds of variations. For example, the aforementioned embodiments have been described for a better understanding of the invention, and are not necessarily limited to those having all of the described configurations. Further, a part of the configuration of an embodiment may be replaced by the configuration of another embodiment, and the configuration of an embodiment may be added with the configuration of another embodiment. In addition, a part of the configuration of each embodiment may be added and/or replaced with another configuration.

REFERENCE SIGNS LIST

1: specimen holder; 2: frame for specimen supporting film; 3: frame window; 4: specimen supporting film; 5: specimen; 6, 6*b*: gas injection nozzle; 7: partition; 8: voltage measuring terminal; 9: grip; 10: gas introduction pipe; 11: O ring; 13: lead wire and measuring terminal connection part; 14: lead wire and measuring terminal connection base; 15: lead wire; 16: partition holding part; 17: leaf spring; 18: voltage generating part or voltage applying part; 19: conductive film; 20: resin; 21: polymer film; 22: electron microscope; 23: electron gun; 24: condenser lens; 25: objective lens; 26: projector lens; 27: fluorescent screen; 28: camera; 29: image display part; 30*a*, 30*b*: flow meter; 31*a*, 31*b*: gas pressure control valve; 32: gas supply unit; 33: voltage control part; 34: voltage current measuring part; 35: electron beam; 36: central axis; 37: specimen holding part; 38: outer shell; 39: heater; 50: membrane electrode assembly; 51: anode; 52: electrolyte membrane; 53: conducting wire; 54: cathode

The invention claimed is:

1. A specimen holder for a charged particle beam device which observes a specimen using a charged particle beam, the specimen holder comprising:
    a first gas injection nozzle capable of injecting a first gas to a first portion of the specimen,
    a second gas injection nozzle capable of injecting a second gas, which is different from the first gas, to a second portion, which is different from the first portion, of the specimen, and
    a partition part provided between the first gas injection nozzle and the second gas injection nozzle.

2. The specimen holder according to claim 1, wherein
    a first electrode is electrically connected to a third portion of the specimen positioned closer to the first gas injection nozzle side than the partition part, and
    a second electrode is electrically connected to a fourth portion of the specimen positioned closer to the second gas injection nozzle side than the partition part.

3. The specimen holder according to claim 2, wherein
    the first electrode provided separately from the first gas injection nozzle is in contact with the third portion of the specimen, and
    the second electrode provided separately from the second gas injection nozzle is in contact with the fourth portion of the specimen.

4. The specimen holder according to claim 2, wherein
the first gas injection nozzle and the second gas injection nozzle are electrically conductive,
the first electrode is in contact with the first gas injection nozzle and the first gas injection nozzle is in contact with the third portion of the specimen,
the second electrode is in contact with the second gas injection nozzle and the second gas injection nozzle is in contact with the fourth portion of the specimen.

5. The specimen holder according to claim 2, wherein
the first gas injection nozzle and the second gas injection nozzle are electrically conductive,
the first gas injection nozzle is in contact with the third portion of the specimen,
the second gas injection nozzle is in contact with the fourth portion of the specimen,
the first gas injection nozzle is the first electrode, and the second gas injection nozzle is the second electrode.

6. The specimen holder according to claim 1, wherein the partition part is a plate-shaped member.

7. The specimen holder according to claim 1, wherein
the specimen holder has a film which covers the first and the second gas injection nozzles and the specimen, and
the film adhered to the specimen forms the partition part.

8. The specimen holder according to claim 2, wherein
the specimen has a thick part and a thin part,
the thick part is used as a contact part that is in contact with the first electrode and the second electrode, and
the thin part is used as an observation part of a transmitted image.

9. The specimen holder according to claim 1, wherein
the specimen holder holds the specimen by the gas injection nozzles.

10. The specimen holder according to claim 1, wherein
the specimen holder has a specimen holding part that holds the specimen, and
an outer shell which rotates coaxially with the specimen holding part,
and the outer shell can be inclined at least ±90 degrees.

11. The specimen holder according to claim 1, wherein
the specimen holder has a specimen supporting film on which the specimen is mounted,
and a heater which heats the specimen is provided on the specimen supporting film.

12. A charged particle beam device including the specimen holder according to claim 1.

13. An observation method, comprising:
preparing a partition part of a first gas to be injected to a first portion of a specimen and a second gas to be injected to a second portion of the specimen,
injecting the first gas to the first portion,
injecting the second gas to the second portion, and
irradiating the specimen with a charged particle beam.

14. A charged particle beam device comprising:
a first gas injection nozzle capable of injecting a first gas to a first portion of a specimen,
a second gas injection nozzle capable of injecting a second gas, which is different from the first gas, to a second portion, which is different from the first portion, of the specimen, and
a partition part provided between the first gas injection nozzle and the second gas injection nozzle.

15. The charged particle beam device according to claim 14, wherein
the charged particle beam device is a transmission electron microscope.

16. The charged particle beam device according to claim 14, wherein
the charged particle beam device is a scanning electron microscope.

17. An observation method, comprising:
preparing a specimen which has a first part with a first thickness and a second part with a second thickness greater than the first thickness,
forming a partition part with a polymer film,
injecting a first gas to the first part of the specimen with a first gas injection nozzle and a second gas to the second part of the specimen with a second gas injection nozzle, wherein the partition part separates the first and second gas injection nozzles from each other,
performing electrical measurement of the specimen, and
irradiating the specimen with a charged particle beam.

18. The observation method according to claim 17, wherein
the first part is irradiated with the charged particle beam.

19. The observation method according to claim 18, wherein
a terminal is brought into contact with the second part.

20. The observation method according to claim 17, wherein
the specimen is prepared by cutting into a wedge shape having the first part and the second part.

21. The observation method according to claim 20, wherein
the first gas is injected from the side of one side surface of the specimen, and the second gas is injected from the side of the other side surface of the specimen.

22. An observation method, comprising:
preparing a specimen which has a first part with a first thickness and a second part with a second thickness greater than the first thickness,
forming a partition part with a polymer film,
applying a voltage to the specimen,
injecting a first gas to the first part of the specimen with a first gas injection nozzle and a second gas to the second part of the specimen with a second gas injection nozzle, wherein the partition part separates the first and second gas injection nozzles from each other, and
irradiating the specimen with a charged particle beam.

23. The observation method according to claim 22, wherein
the first part is irradiated with the charged particle beam.

24. The observation method according to claim 23, wherein
a terminal is brought into contact with the second part.

25. The observation method according to claim 22, wherein
the specimen is prepared by cutting into a wedge shape having the first part and the second part.

26. The observation method according to claim 25, wherein
the first gas is injected from the side of one side surface of the specimen, and the second gas is injected from the side of the other side surface of the specimen.

* * * * *